United States Patent [19]

Amann

[11] 4,352,187
[45] Sep. 28, 1982

[54] SEMICONDUCTOR LASER DIODE

[76] Inventor: Markus C. Amann, Strassbergerstrasse 9/506c, 8000 Muenchen 40, Fed. Rep. of Germany

[21] Appl. No.: 105,126

[22] Filed: Dec. 19, 1979

[30] Foreign Application Priority Data

Dec. 28, 1978 [DE] Fed. Rep. of Germany ....... 2856507

[51] Int. Cl.³ .............................................. H01S 3/19
[52] U.S. Cl. ...................................... 372/46; 357/15; 357/17; 357/65; 372/45
[58] Field of Search .................... 331/94.5 H; 357/18, 357/15, 65, 17; 372/45, 46

[56] References Cited

U.S. PATENT DOCUMENTS 4,099,305 7/1978 Cho et al. ................. 331/94.5 H X
4,121,179 10/1978 Chinone et al. ............... 331/94.5 H
4,206,468 6/1980 Carballes ................... 331/94.5 H X Primary Examiner—James W. Davie
Attorney, Agent, or Firm—Hill, Van Santen, Steadman, Chiara & Simpson

[57] ABSTRACT

A semiconductor laser diode is disclosed with a connection electrode consisting of a chromium/gold alloy on a highly-doped gallium arsenide layer. The gallium arsenide layer is strip-shaped and overlies a further lesser doped layer of gallium aluminum arsenide. The chromium/gold contact has a low-resistance junction only in the region of the more highly doped layer so that a strip-shaped restriction of the current path occurs in the semiconductor body. Accordingly, a laser-active zone which is only strip-shaped is achieved.

7 Claims, 2 Drawing Figures

SEMICONDUCTOR LASER DIODE

BACKGROUND OF THE INVENTION

The present invention relates to a semiconductor laser diode having a laser active semiconductor layer, a lesser doped semiconductor layer on the laser-active layer, a first more highly doped semiconductor layer on the lesser doped layer, a metal electrode layer on the highly doped semiconductor layer, and an additional semiconductor layer and additional electrode on the opposite side of the laser active layer.

Semiconductor strip laser diodes are known from the prior art in which a region is designed in a semiconductor body with a predetermined layer sequence consisting of n and p conductive semiconductor material in such manner that the amplification of coherent radiation corresponding to a laser diode practically occurs only within this region. The object of such a strip shape in a semiconductor strip laser diode is to suppress the transversal modes occurring with respect to directions other than the desired propagation direction of the generated laser beam and/or to confine the current between the electrodes of the semiconductor laser diode through the semiconductor body which is too widely spread in a lateral direction with respect to this desired beam direction.

Such semiconductor strip layer diodes, i.e. semiconductor laser diodes with a laser-active region forming the resonant cavity means for generation of laser radiation and which are designed only in a strip-like and narrowly limited lateral fashion, have been until now constructed such that a region has been generated with the assistance of expensive proton implantation, or that, in accordance with an earlier state of development, blocking pn junctions have been provided in the semiconductor body. Other structural types for such a laser diode are the so-called buried laser manufactured with the assistance of a double epitaxy with a buried laser-active layer or the channeled substrate planar laser in which, due to its structure, essentially only a control of the formation of the oscillation modes is achieved.

SUMMARY OF THE INVENTION

An object of the present invention is to specify a structure for a semiconductor laser diode which can be more simply manufactured.

This object is inventively achieved with a laser diode of the invention wherein the upper electrode layer is comprised of a chromium/gold alloy. A first highly doped semiconductor layer in contact with the alloy comprises p conductivity type gallium arsenide with a doping higher than $5 \times 10^{18}$ cm$^{-3}$. A second lesser doped semiconductor layer between the upper layer and laser-active region comprises gallium aluminum arsenide and has a p doping level which forms a junction having at least a high resistance with the chromium/gold alloy relative to a junction between the first layer and the alloy, which junction has a much lower resistance. The highly doped semiconductor layer has its lateral width dimension orthogonal to a direction of laser propagation corresponding to a width of the laser-active zone having a strip-shape and which comprises the resonant cavity for the laser radiation.

The invention is based on the employment of a specific property of a chromium/gold contact on semiconductor material such as gallium arsenide. As fundamentally known per se, a Cr/Au contact on highly doped p gallium arsenide having a (p) doping of, for example, greater than $10^{19}$cm$^{-3}$, is of low resistance, but has a very high-resistance on p gallium arsenide which is less highly doped, such as $10^{18}$cm$^{-3}$. This high resistance of the contact is increased due to the formation of blocking voltages for low doped GaAlAs.

The invention creates a semiconductor laser diode for the manufacture of which the following are not required to achieve limitation of the laser active zone: proton implantation; double epitaxy with processing operations to be carried out between the epitaxial steps; diffusion steps; or oxidation steps. A semiconductor laser diode according to the present invention, in which a limitation of the current path is achieved with the assistance of a semiconductor-specific blocking effect can be manufactured in a significantly simplified manner in contrast to previous diodes.

DESCRIPTION OF THE PREFERRED EMBODIMENTS

DESCRIPTION OF THE PREFERRED EMBODIMENTS

Figure 1:
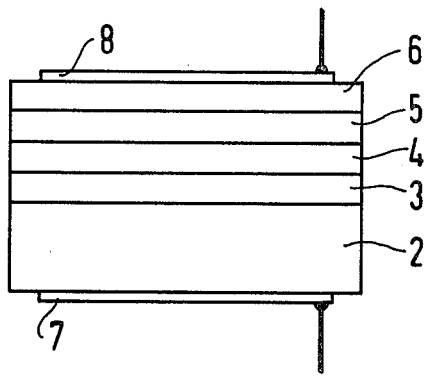
FIG. 1 shows a schematically illustrated four-layer double-hetero structure of a GaAlAs/GaAs laser diode.

The structure of the known double-hetero laser diode according to FIG. 1 has an n conductive semiconductor substrate body 2 consisting of, for example, gallium arsenide. Applied to one of its surfaces and following one another in succession, are the following layers: an n conductive gallium aluminum arsenide layer 3; a p or, under certain conditions, also n conductive gallium arsenide layer 4; a p conductive gallium aluminum arsenide layer 5; and a highly doped (p+) p conductive gallium arsenide layer 6. Electrode coatings are referenced 7 and 8.

The current flux between electrodes 7 and 8 permeates the entire semiconductor body in its entire cross-section, this semiconductor body consisting of the substrate 2 and the layers 3 through 6 situated thereon (orthogonal to the permeation direction). The desired propagation direction of the laser radiation to be generated with this known diode is perpendicular to the plane of the FIG. 1 illustration. In this direction, the semiconductor body of the known diode of FIG. 1 has a dimension of, for example, 300 μm. In the direction perpendicular thereto (width in FIG. 1) and to the permeation direction between the electrodes 7 and 8, such a semiconductor body cannot be provided as narrow as desired, if only for reasons of stability and/or contacting. It can also not be made narrow enough that, on the one hand, the most effective possible radiation generation for the laser radiation occurs and, on the other hand, this radiation is as free as possible of transversal modes. For this reason, the techniques already cited above but not discussed here in further detail of known laser diodes have been undertaken in order to constrict in width the current flow in the semiconductor body between the electrodes.

Figure 2:
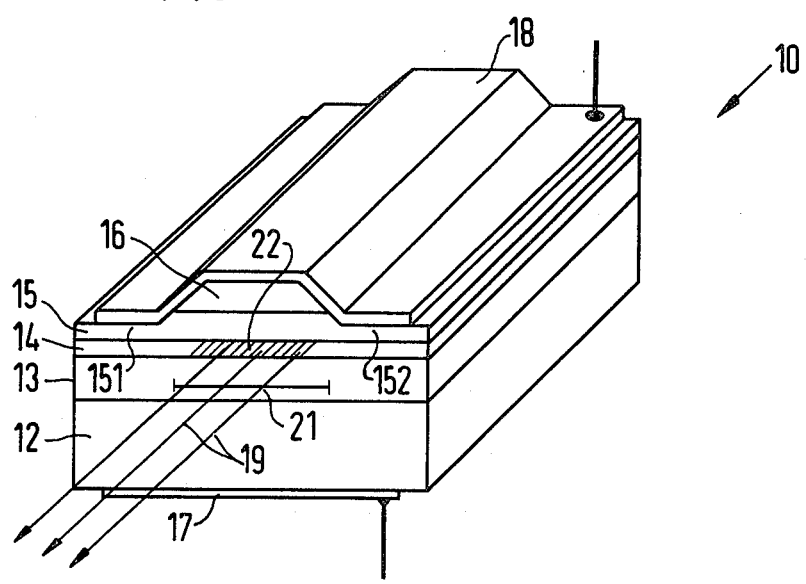
FIG. 2 shows a double-hetero laser diode constructed according to the invention.

FIG. 2 shows a strip laser semiconductor body 10 constructed according to the invention. This comprises a substrate body 12 consisting of, for example, n+conductive gallium arsenide. The dimension of the semiconductor body selected in the propagation direction of the laser radiation (direction perpendicular to the plane of the drawing in FIG. 2) is, for example, 200 μm. Its dimension lateral thereto (present in the illustration of FIG. 2 as width) is, for example, 200 μm. The thickness (height in FIG. 2) of the substrate body 12 is, for example, 80 μm. As can be seen from FIG. 2, a first layer 13 consisting, for example, of n type $Ga_{0.5}Al_{0.5}As$ with an n doping of, for example, $1 \times 10^{17} cm^{-3}$, is situated on this substrate body 12. The thickness of this layer 13 is, for example, 0.9 μm. The further effective layer 14 situated thereon which is laser-active in operation consists, for example, of optionally p or n conductive GaAs with a p or n doping of $1 \times 10^{17} cm^{-3}$. The layer 15 which is in turn situated thereon and which is present in FIG. 1 for comparison with a uniform thickness of, for example, 0.8 μm over the entire surface on the layer 14, then consists of p conductive gallium aluminum arsenide of the general formula gallium $(1-x)$ aluminum $(x)$ arsenide where $0 \leq x \leq 1$, for example, of $Ga_{0.5}Al_{0.5}As$ whose p doping is approximately $1 \times 10^{17} cm^{-3}$. The doping level is preferably independent of the value of x. The layer 16, which is situated on layer 15, and, which like layer 15 extends over the entire surface and is adapted to the preceeding layers, consists, for example, of p+ conductive gallium arsenide with a doping of, for example, $2 \times 10^{19} cm^{-3}$. The thickness of layer 16 advantageously lies between 0.3 and 0.5 μm, preferably at 0.3 μm. In relation to the thickness of layer 15, the thickness of layer 16 should be thin and should correspond to a ratio of 1:2 to 1:5, for example. By so doing, the manufacturing process is simplified as shown below.

As can be seen from the perspective view of FIG. 2, all of the lateral components of layer 16 must be totally eliminated besides the laser-active area and, advantageously, lateral components of layer 15 are removed except for a remaining residual thickness. This residual thickness still amounts, for example, to 0.4 μm and thus suffices to prevent an electric contact to the neighboring layer 14 from occurring. The remaining residual thickness components of the original layer 15 are referenced 151 and 152. This removal of semiconductor material of layers 15 and 16 preferably ensues by means of photoresist and etching technology. As can be seen from FIG. 2, the strip-shape component of layer 16 remaining has a width reduced with respect to the substrate body 11 of, for example, only 3 to 10 μm. The cross-section effective for the current flow resulting from the reduced width and the length (200 μm) which has remained unchanged, determines the strip-shape, or, respectively, strip-surface of the laser-active region in the entire semiconductor body 10. The actual (strip-shape) laser-active region indicated with 21, however, lies in layer 14.

The diode of this invention is connected with its electrodes to the supply voltage in such manner that it is operated in a forward direction. As can be seen from FIG. 2, an electrode layer 18 consisting of a chromium/gold alloy projecting laterally over the remaining portion of layer 16, is situated on that surface of the semiconductor body 10 remaining after removal of material of layers 16 and 15. This material selection is matched to the gallium arsenide or, respectively, gallium aluminum arsenide of layers 16 and 15. A very low-resistance contact exists between layer 16 and electrode 18. In contrast thereto, the contact between the electrode 18 and layer 15 has a blocking effect property and high-resistance. The difference in contacting as noted above leads to the fact that a current flux (greater than the threshold current) sufficient for the generation of the laser radiation exists only in the strip region of the semiconductor body 10, which is decisive for the generation of this laser radiation. On the other hand, in regions 151 and 152, in which direct contact between the contact layer 18 and the material of layer 15 exists, comparatively no current flux occurs, so that no generation of laser radiation occurs in regions of the semiconductor body 10 lying to the side of region 21. This limitation in width also leads to a reduction of the formation of transversal oscillation modes of the generated laser radiation.

The actual laser-active area is here indicated with shading and referenced 22. In accordance with a decrease of the current density in the lateral direction (width in FIG. 2), the actual laser-active area 22 can be further limited with respect to the current flux region 21. The counter-electrode 17 situated on the substrate 12 consists, for example, of a gold/germanium/nickel alloy whose employment for this purpose is known per se and which forms a non-blocking and low-resistance junction preferably on n doped gallium arsenide.

The embodiment according to FIG. 1 also contains a further development of the invention which leads to further improvements of the laser properties. This embodiment consists of the removal of material of layer 15 in portions of the semiconductor body 10 lying laterally of the strip region 21. By so doing, a lateral delimitation in layer 15 is also achieved. This lateral delimitation additionally reduces a spread of the current path in the lateral direction which otherwise occurs. By so doing, a preferential excitation of the transversal basic mode can additionally be achieved.

With the laser diode of the invention there is no need for particular care in choosing a specific width (21—at right angles to the laser radiation direction) of the entire semiconductor body and/or of electrode 18.

The laser radiation emerging from the inventive laser diode 10, i.e. from the laser-active zone 22, is indicated in FIG. 2 with arrows 19. These arrows also indicate the propagation direction of the laser radiation within the semiconductor body or, respectively, zone 22.

In manufacturing the diode of FIG. 2 layers 15 and 16 may be simultaneously etched in the same processing step.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A semiconductor laser diode, comprising: a layer sequence of a chromium/gold metal electrode layer connecting to a first electrode terminal, a first highly-doped semiconductor layer of first conductivity type and formed of gallium arsenide, a second semiconductor layer of first conductivity type having a lesser doping than the first layer and formed of gallium aluminum arsenide, a gallium arsenide third semiconductor layer in which a strip shaped laser active zone is to be formed, a fourth semiconductor layer of gallium aluminum arsenide of second conductivity type, and a second electrode terminal coupled to the fourth semiconductor layer; a resonant cavity means comprised of said strip-shaped laser active zone; and second lesser doped semiconductor layer having a doping level such that the layer forms a junction having a high resistance with the chromium/gold alloy relative to a junction resistance formed between the first layer and the alloy when a voltage is applied to the first and second electrode terminals; the first semiconductor layer having a lateral width dimension orthogonal to a direction of laser propagation chosen to be substantially the same as a desired width of the desired strip-shaped laser-active zone to be formed in the third semiconductor layer; the second semiconductor layer having a substantial part of its thickness removed at regions beyond said lateral width dimension of the first layer and portions of the metal electrode layer being extended to cover the regions; and the reduced thickness region and the width of the first semiconductor layer defining a resultant lateral dimension of the laser active zone when the voltage is applied to the first and second terminals so as to achieve a preferred laser excitation in a basic transversal mode.

2. The diode according to claim 1 wherein said high-resistance junction is a blocking junction.

3. The diode according to claim 1 wherein a fifth semiconductor layer formed of gallium arsenide and having a second conductivity type doping level relatively higher than the fourth semiconductor layer is formed on the fourth semiconductor layer and connects the second electrode terminal to the fourth semiconductor layer.

4. The diode of claim 1 wherein the second semiconductor layer is comprised of gallium $(1-X)$ aluminum (X) arsenide with $0 \leq X \leq 1$ and with a level of P doping which, independent of a size of X, forms the junction having a high resistance with the chromium/gold alloy.

5. The diode according to claim 4 wherein the value X is selected between 0.25 and 0.6 and the level of doping in the second semiconductor layer is smaller than $10^{18}$ cm$^{-3}$.

6. The diode of claim 1 wherein at the regions of the second semiconductor layer having substantial portions of its thickness removed, the layer has a thickness of approximately 0.4 μm.

7. In a semiconductor laser diode formed of a layer sequence of a metal electrode layer connecting to a first electrode terminal, a first highly-doped semiconductor layer of first conductivity type, a second lesser doped semiconductor layer of first conductivity type, a third semiconductor layer in which a strip-shaped laser-active zone is to be formed, a fourth semiconductor layer of second conductivity type, and a second electrode terminal coupled to the fourth semiconductor layer, the improvement comprising: a junction having a low resistance formed between the metal electrode layer and the first semiconductor layer and a junction having a relatively higher resistance formed between the same metal electrode layer and the second semiconductor layer as result of a blocking junction formed when a voltage is supplied across the first and second terminals; the first semiconductor layer having its lateral width dimension chosen so as to define a desired strip-shaped laser-active zone width formed in the third semiconductor layer when the voltage is applied to the first and second terminals; and the second semiconductor layer having a substantial part of its thickness removed at regions beyond said lateral dimension of the first layer and portions of the metal electrode layer being formed in said regions, the reduced thickness regions and the width of the first semiconductor layer defining a resultant lateral dimension of the laser active zone when the voltage applied to the first and second terminals so as to achieve a preferred laser excitation in a basic transversal mode.

* * * * *